United States Patent [19]

Moore

[11] Patent Number: 4,459,493

[45] Date of Patent: Jul. 10, 1984

[54] ABSOLUTE MAGNITUDE CIRCUIT

[75] Inventor: Bruce D. Moore, Sunnyvale, Calif.

[73] Assignee: Raytheon Company, Lexington, Mass.

[21] Appl. No.: 450,834

[22] Filed: Dec. 17, 1982

[51] Int. Cl.³ ............................ H03K 5/20; H03K 5/00
[52] U.S. Cl. ..................................... 307/127; 307/494; 328/26
[58] Field of Search ............... 307/127, 151, 262, 494, 307/125; 328/26

[56] References Cited

U.S. PATENT DOCUMENTS

| | | | |
|---|---|---|---|
| 2,822,474 | 2/1958 | Boecker | 328/26 |
| 3,509,474 | 4/1970 | Arnold et al. | 307/494 X |
| 4,317,052 | 2/1982 | Morris | 328/26 X |
| 4,354,235 | 10/1982 | Blakeslee | 328/26 X |

Primary Examiner—Reinhard J. Eisenzopf
Assistant Examiner—Derek Jennings
Attorney, Agent, or Firm—Richard M. Sharkansky; Joseph D. Pannone

[57] ABSTRACT

An absolute magnitude circuit is provided wherein an input signal is fed to one input of a differential amplifier circuit, the output of such amplifier circuit being coupled to a second input thereof through a negative feedback loop, such feedback loop having two output terminals with an inverter coupled therebetween; and a switching circuit, responsive to the polarity of the input signal, for coupling a selective one of the pair of output terminals to an output of the absolute magnitude circuit, with the voltage at the output of the absolute value circuit having the same polarity independent of the polarity of the input signal.

With such arrangement, since the input circuitry to the operational amplifier is independent of the polarity of the input signal, the gain and biasing of the absolute magnitude circuitry is independent of input signal polarity.

7 Claims, 2 Drawing Figures

ABSOLUTE MAGNITUDE CIRCUIT

BACKGROUND OF THE INVENTION

This invention relates generally to electronic circuitry and more particularly to absolute value circuitry.

As is known in the art, it is sometimes desirable to provide an electronic device which produces a signal proportional to the absolute value of an input signal. In known circuits of such type, operational amplifiers are included and esistor biasing network. A switching device selectively couples to the input of the operational amplifier either the input signal or an inverted version of the input signal depending on the polarity of the input signal. With such arrangements, however, the input biasing resistors cause errors in the operation of the absolute value circuit because of biasing currents passing through such resistors. Further, in such known circuits, the resistors in the resistor network which are coupled between the input signal and the input of the operational amplifier are not the same resistors as those used to couple an inverted version of the input signal to the input of the operational amplifier. Thus, since different resistors are used in the coupling processes, adjustability of the gain of the circuit using such resistors is relatively difficult to control particularly when it is desired that the same gain be provided to the input signal regardless of its polarity.

SUMMARY OF THE INVENTION

In accordance with the present invention, an absolute magnitude circuit is provided wherein an input signal is fed to one input of a differential amplifier circuit, the output of such amplifier circuit being coupled to a second input thereof through a negative feedback loop, such feedback loop having two output terminals with an inverter coupled therebetween; and a switching circuit, responsive to the polarity of the input signal, for coupling a selective one of the pair of output terminals to an output of the absolute magnitude circuit, with the voltage at the output of the absolute value circuit having the same polarity independent of the polarity of the input signal.

With such arrangement, since the input circuitry to the operational amplifier is independent of the polarity of the input signal, the gain and biasing of the absolute magnitude circuitry is independent of input signal polarity.

BRIEF DESCRIPTION OF THE DRAWINGS

The foregoing features of the invention, as well as the invention itself, may be more fully understood from the following detailed description of the drawings, in which.

DESCRIPTION OF THE PREFERRED EMBODIMENT

Figure 1:
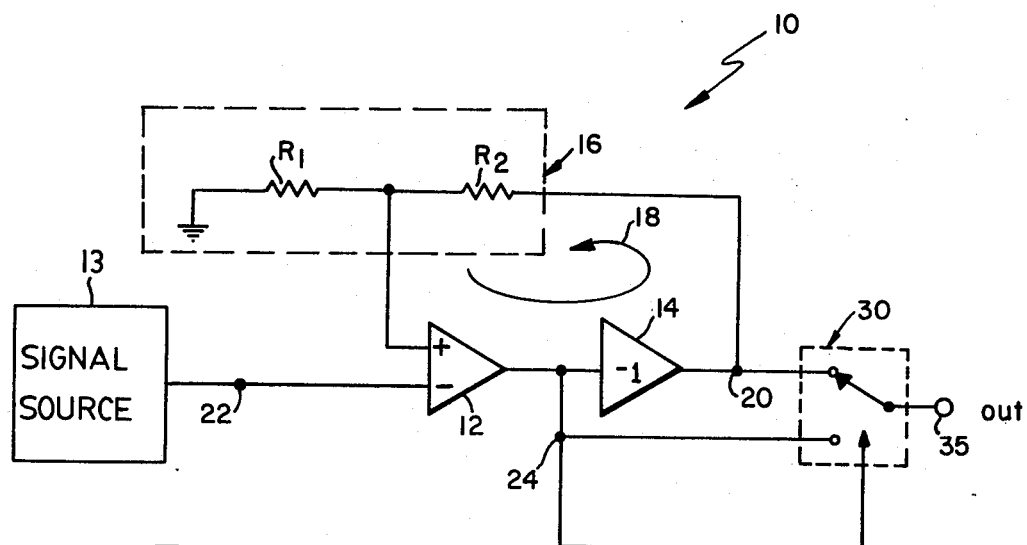
FIG. 1 is a block diagram of an absolute value circuit according to the invention.

Referring now to FIG. 1, an absolute value circuit 10 is shown to include an operational amplifier 12 having a negative input thereof coupled to an input signal source 13 and an output coupled to the positive input terminal thereof through an inverter 14 and a voltage divider network 16. In particular, the output of inverter 14 is coupled to the positive terminal of the operational amplifier 12 through a resistor $R_2$; such positive terminal also being coupled to ground through a resitor $R_1$. It follows then that the voltage divider network 16 may be represented by a transfer function $(R_1)/(R_1+R_2)$. Thus, the comparator 12, inverter 14 and resistor network 16 are arranged to provide a negative feedback loop designated by arrow 18. Further, the operational amplifier 12 has a relatively high gain and high input impedance. Therefore, the gain between the output of the inverter at output terminal 20 and the input terminal 22 of circuit 10 may be represented as $(R_1+R_2)/R_1 = [1+(R_2/R_1)]$. A second output terminal 24 is coupled to the output of operational amplifier 12. It follows then that the gain between output terminal 24 and input terminal 22 is $-[1+(R_2/R_1)]$. It further follows then that signals at output terminals 20, 24 are of opposite polarity because an inverter 14 is coupled between such output terminals 20, 24; however, the output signals at terminals 20 and 24 are equal to each other in magnitude. Thus, the output signals at output terminals 20, 24 are equal to each other in magnitude, but opposite from each other in polarity.

Electronic switch 30 is a single pole, double throw electronic switch which, in response to the polarity of the signal produced at output terminal 24, (and hence, the polarity of the input signal fed to input terminal 22) couples to output 35 either output terminal 20 or output terminal 24. That is to say, if the polarity of the signal fed to input terminal 22 is positive, the polarity of the signal at output terminal 20 will also be positive and switch 30 electrically couples terminal 20 to output terminal 35. Conversely, if the polarity of the signal fed to input terminal 22 is negative, the polarity of the signal at output terminal 20 will be negative, however, the polarity of the signal at output terminal 24 will be positive, in which case switch 30 couples output terminal 24 to output terminal 35 so that the voltage at output terminal 35 will be opposite that of the voltage fed to the input terminal 22. It follows then that the polarity at output terminal 35 will also be positive regardless of whether the voltage at input terminal 22 is positive or negative.

Figure 2:
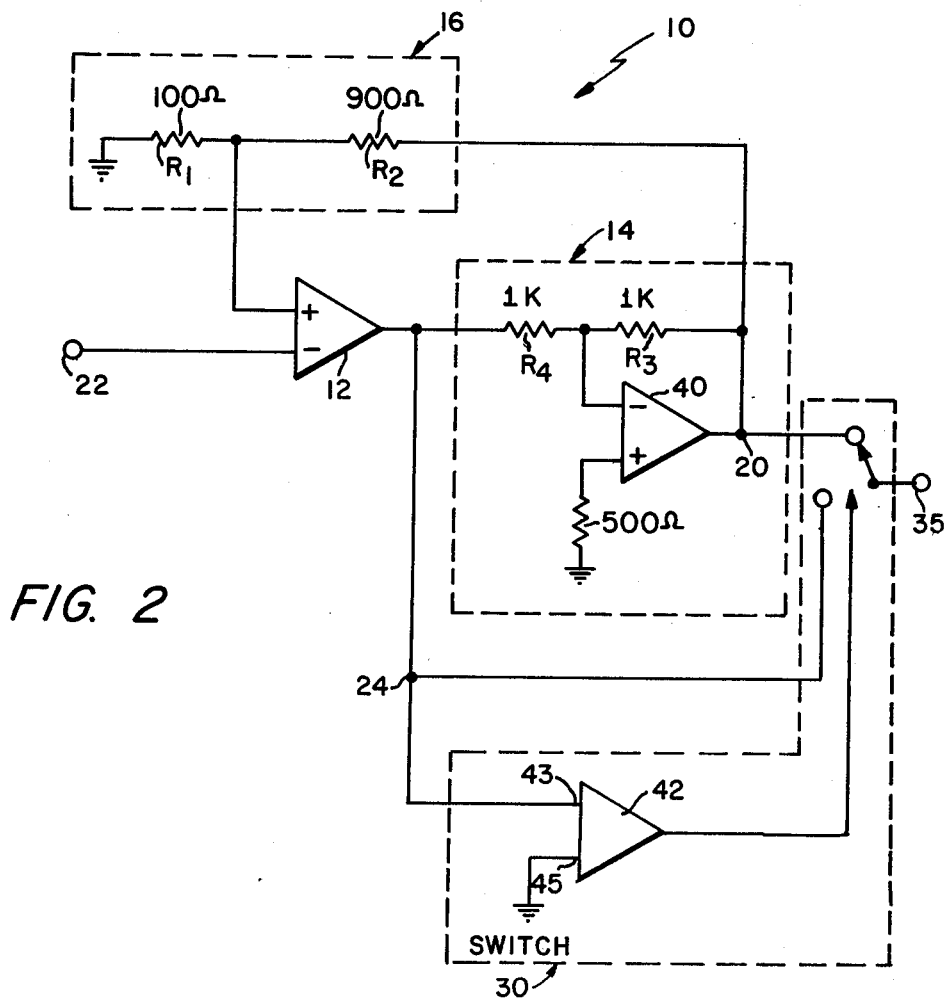
FIG. 2 is a schematic diagram of the absolute value circuit of FIG. 1.

Referring now to FIG. 2, the inverter circuit 14 is shown in detail to include a second operational amplifier 40 having the positive terminal thereof coupled to ground through a 500 ohm resitor. The output of comparator 40 is coupled to output terminal 20 and to both the negative input of operational amplifier 40 through a 1 K ohm resistor $R_3$ and to resistor $R_2$, here a 900 ohm resistor. The output of operational amplifier 12 in addition to being coupled to output terminal 24 is coupled to the negative input of operational amplifier 40 through a resistor $R_4$, here 1000 ohms. The output of operational amplifier 12 is also coupled to a comparator circuit 42 which is included in the electronic switch 30. The comparator 42 has one input terminal 43 coupled to ground and the other input terminal 45 coupled to the output of operational amplifier 12 as shown. It follows then that a control signal is produced at the output of amplifier 42, such control signal having a logical 1 state if the voltage at the input terminal 43 if comparator 42 is positive (i.e., greater than ground potential) in which case the polarity of the input signal at input terminal 22 is negative and a logical 0 signal is produced by such control signal if the input to the input terminal 43 of operational amplifier 42 is negative (i.e., less than ground potential) and in which case the polarity of the input signal at input terminal 22 is positive. It follows then that the control signal produced at the output of operational amplifier 42, which is in effect a logic circuit, producing a signal having a logical state indicative of the polarity of the input signal fed to terminal 22. This control signal is used to electrically couple output terminal 35 to either output terminal 20 or output terminal 24. In particular, if the logic signal produced at the output of comparator 42 is 1 (thereby indicating that the input signal has a negative polarity), output terminal 35 becomes coupled to output terminal 24 whereas the logical signal produced at the output of amplifier 42 is logical 0 (thereby indicating that the input signal at terminal 22 has a positive polarity) output terminal 35 becomes electrically coupled to output terminal 20. In this way, as described above, the polarity of the signal produced at output terminal 35 will be positive independent of the polarity of the input signal fed to terminal 22.

Having described a preferred embodiment of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. An electronic circuit for producing an output signal having the same predetermined polarity independent of the polarity of an input signal, comprising:
    (a) a negative feedback loop having an inverter and a pair of outputs separated by the inverter; and
    (b) switching means responsive to the polarity of the input signal, for coupling a selected one of the pair of outputs of the feedback loop to an output, such output providing the output signal with the same predetermined polarity independent of the polarity of the input signal.

2. The electronic circuit recited in claim 1 wherein the switching means includes a comparator having a pair of input terminals, a first one thereof being coupled to a predetermined reference potential and a second one thereof being coupled to a source of the input signal.

3. The electronic circuit recited in claim 2 wherein the comparator circuit includes means for producing a control signal having a logical state indicative of the polarity of the input signal and wherein the switching means includes means responsive to the logical state of the control signal for coupling a selected one of the pair of outputs of the feedback loop to the output of the electronic circuit, such one of the pair of outputs being coupled to the output of the electronic circuit selectively in accordance with the logical state of the control signal.

4. An electronic circuit for producing an output signal having the same predetermined polarity independent of the polarity of an input signal, comprising:
    (a) a negative feedback loop having: an input fed by the input signal; an inverter; a pair of outputs separated by the inverter; and a network for establishing gains between the input and the pair of outputs with substantially proportional magnitudes, such network provides such gains independent of the polarity of the input signal; and
    (b) switching means, responsive to the polarity of the input signal, for coupling a selected one of the pair outputs of the feedback loop to a circuit output terminal, such circuit output terminal providing the output signal with the same predetermined polarity independent of the polarity of the input signal.

5. The electronic circuit recited in claim 4 wherein the switching means includes a comparator having a pair of input terminals, a first one thereof being coupled to a predetermined reference potential and a second one thereof being coupled to the input of the feedback loop.

6. The electronic circuit recited in claim 5 wherein the comparator circuit includes means for producing a control signal having a logical state indicative of the polarity of the input signal and wherein the switching means includes means responsive to the logical state of the control signal for coupling a selected one of the pair of outputs of the feedback loop to the circuit output terminal, such one of the pair of outputs being coupled to the circuit output terminal selectively in accordance with the logical state of the control signal.

7. The electronic circuit recited in claim 6 wherein the gains from the input to the pair of outputs are substantially equal to each other.

* * * * *

UNITED STATES PATENT OFFICE
CERTIFICATE OF CORRECTION

Patent No. 4,459,493              Dated July 10, 1984

Inventor(s) Bruce D. Moore

It is certified that error appears in the above-identified patent and that said Letters Patent are hereby corrected as shown below:

Column 1, Line 11:   After "and" delete --esistor--;

Line 11:   Before "biasing" insert --are fed by the input signal through a resistor--; and Column 3, Line 11:   After "whereas" insert --as--.

Signed and Sealed this

*Twenty-sixth* Day of *February 1985*

[SEAL]

*Attest:*

DONALD J. QUIGG

*Attesting Officer*     *Acting Commissioner of Patents and Trademarks*